United States Patent
Carman

(10) Patent No.: US 12,131,771 B2
(45) Date of Patent: *Oct. 29, 2024

(54) SENSE AMPLIFIER REFERENCE VOLTAGE THROUGH SENSE AMPLIFIER LATCH DEVICES

(71) Applicant: Micron Technology, Inc., Boise, ID (US)

(72) Inventor: Eric Carman, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 217 days.

This patent is subject to a terminal disclaimer.

(21) Appl. No.: 17/860,470

(22) Filed: Jul. 8, 2022

(65) Prior Publication Data

US 2023/0395131 A1 Dec. 7, 2023

Related U.S. Application Data

(60) Provisional application No. 63/348,345, filed on Jun. 2, 2022.

(51) Int. Cl.
G11C 11/4091 (2006.01)

(52) U.S. Cl.
CPC ............... *G11C 11/4091* (2013.01)

(58) Field of Classification Search
CPC .................................. G11C 11/4091
See application file for complete search history.

(56) References Cited

U.S. PATENT DOCUMENTS

| | | | |
|---|---|---|---|
| 10,535,388 B1* | 1/2020 | Ingalls | G11C 7/065 |
| 10,586,586 B1* | 3/2020 | Lee | G11C 11/4085 |
| 10,839,873 B1* | 11/2020 | Lee | G11C 7/1048 |
| 11,967,362 B2* | 4/2024 | Vo | G11C 11/2273 |
| 2018/0226116 A1* | 8/2018 | Derner | G11C 11/2257 |
| 2021/0142842 A1* | 5/2021 | Nagata | G11C 7/065 |

* cited by examiner

*Primary Examiner* — Douglas King
(74) *Attorney, Agent, or Firm* — Fletcher Yoder, P.C.

(57) ABSTRACT

Sense amplifiers for memory devices include latch transistors that are used to latch values based on charges in memory cells. A first latch transistor applies a reference voltage to a first gut node of the sense amplifier via one of these latch transistors. The sense amplifier also applies a charge to a second gut node from a memory cell corresponding to the sense amplifier. The sense amplifier also latches a value in the sense amplifier based on a relationship between the reference voltage and the charge.

23 Claims, 6 Drawing Sheets

SENSE AMPLIFIER REFERENCE VOLTAGE THROUGH SENSE AMPLIFIER LATCH DEVICES

CROSS-REFERENCE TO RELATED APPLICATIONS

This application claims priority to U.S. Provisional Application No. 63/348,345, filed Jun. 2, 2022, entitled "Sense Amplifier Reference Voltage Through Sense Amplifier Latch Devices," the disclosure of which is incorporated by reference in its entirety for all purposes.

BACKGROUND

Field of the Present Disclosure

Embodiments of the present disclosure relate generally to memory devices. More specifically, embodiments of the present disclosure relate to sense amplifiers of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor. In some embodiments, data approximation memory may be used to improve energy efficiency. However, approximation memory may expose data elements to errors. One mechanism to interface with approximate data is AxRAM that is configured to reduce the likelihood of execution crashes.

AxRAM (and other types of) memory devices utilize sense amplifiers used by the memory devices during read operations. Specifically, the read circuitry of the memory device utilizes the sense amplifiers to receive low voltage signals and amplify the small voltages to enable the memory device to interpret the data properly. However, due to the large number of sense amplifiers in the memory device any excess consumption of resources (e.g., power and/or area) in a sense amplifier may impact the efficiency of the memory device's resources even when the change in a single sense amplifier is relatively small. Furthermore, some sense amplifiers may be sensitive to threshold voltage mismatches between sense amplifier latch devices (e.g., NMOS and/or PMOS transistors).

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, the read circuitry of the memory device utilizes the sense amplifiers to receive low voltage (e.g., low differential) signals and amplify the small voltage differences to enable the memory device to interpret the data properly. However, some embodiments of the sense amplifiers consume excess resources (e.g., power and/or area). Thus, as taught herein, the sense amplifiers may be modified to omit dedicated reference voltage transistors used to charge gut nodes to a reference voltage level to be used in determining logic values from voltages used to charge other gut nodes. In other words, in a gut node pair, a first gut node stores a charge proportional to the charge stored in a memory cell while the second gut node stores the reference voltage. When the first gut node's charge is greater than the charge of the second gut node, the data may be interpreted as a logic high value. However, when the first gut node's charge is less than the charge of the first gut node, the data may be interpreted as a logic low level. As noted, the reference voltage may charge the second gut node using a dedicated reference transistor. However, these transistors consume space. To reduce area consumed by the sense amplifier, the reference transistors may be omitted. Instead of the dedicated reference transistors, latch transistors (e.g., PMOS transistors) may be used to deliver reference voltages to the appropriate gut nodes. By using the latch transistors also used in latching and amplification, the sense amplifiers may be smaller and consume less area in the memory device while maintaining timing and/or operation capabilities.

Figure 1:
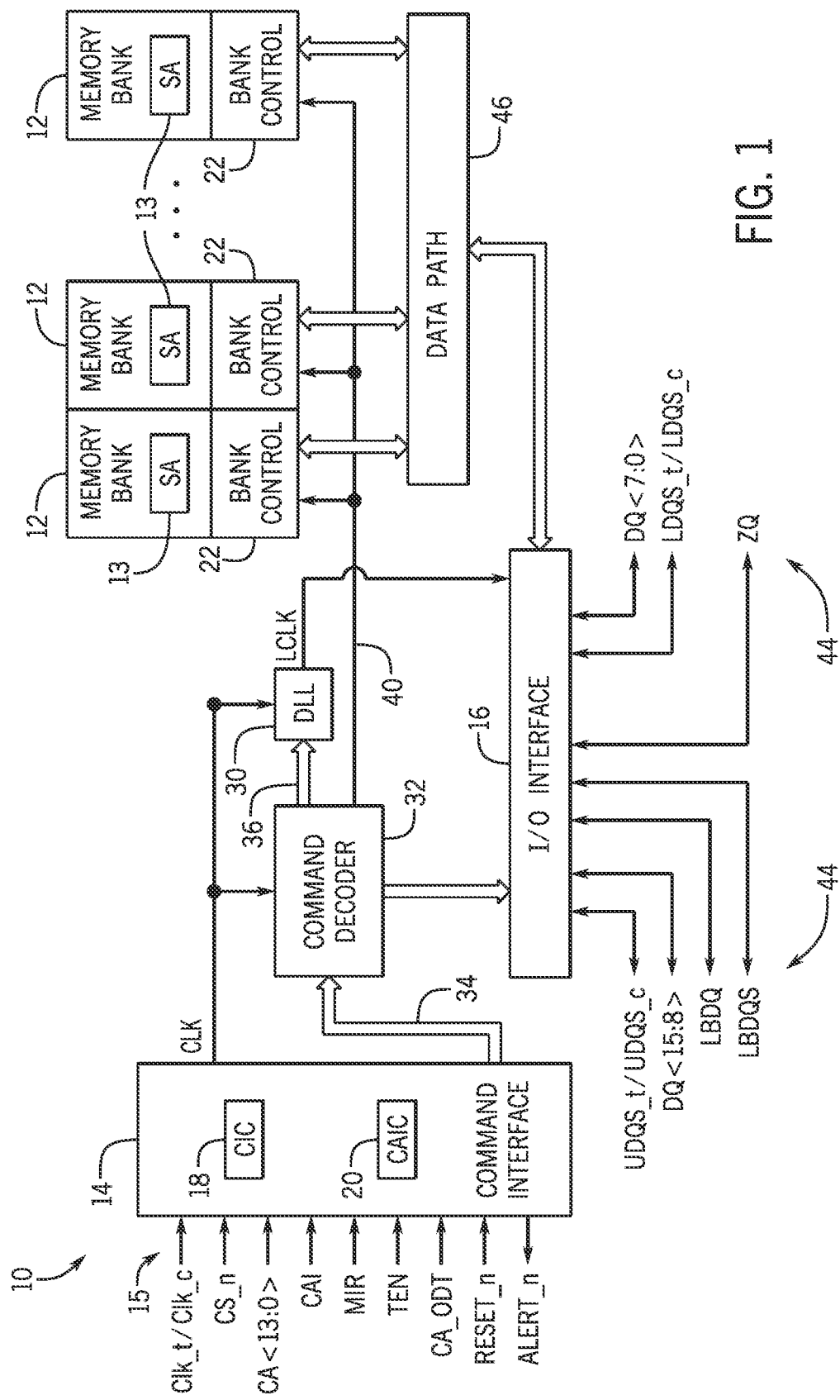
FIG. 1 is a simplified block diagram illustrating certain features of a memory device having sense amplifiers, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly.

The memory device 10 may include a command interface 14 and an input/output (110) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar/complementary clock signal Clk_c. The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the complementary clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a low-power double data rate (LPDDR) device, a double data rate type 4 DRAM (DDR4) device, a ferroelectric RAM device, or a combination of different types of memory devices).

Figure 2:
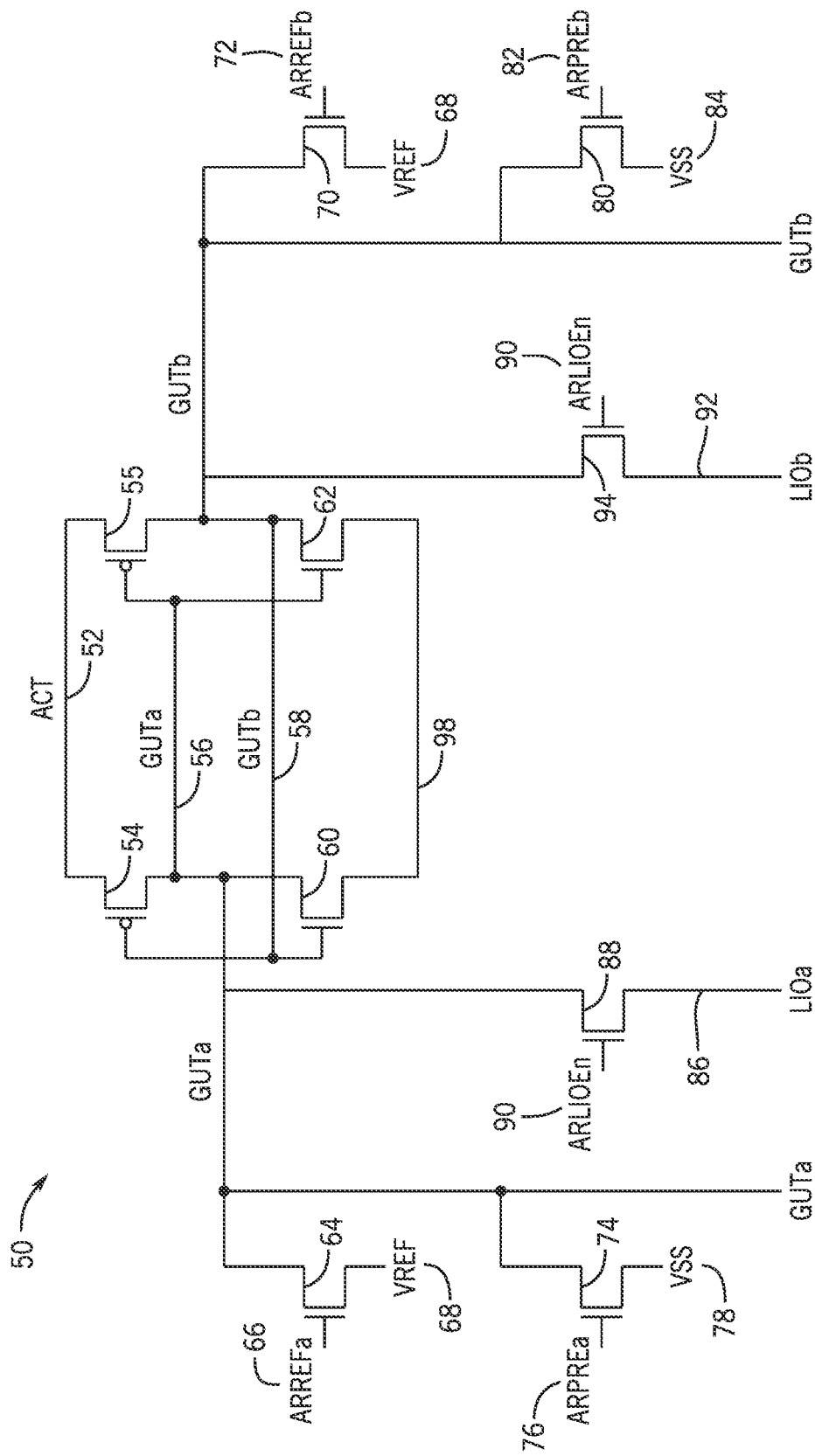
FIG. 2 is a circuit diagram of an embodiment of the sense amplifiers of FIG. 1 with reference transistors/switches, according to an embodiment of the present disclosure.

FIG. 2 is a circuit diagram of a sense amplifier 50 that may be implemented as an embodiment of the sense amplifiers 13 of FIG. 1. Although only a single sense amplifier 50 is shown, multiple sense amplifiers 13 are included in the memory device 10 that function similarly and may share at least some control signals and/or supply voltages.

As illustrated, the sense amplifier 50 receives an ACT signal 52 at terminals (e.g., source terminals) of the PMOS transistors 54 and 55 via a "top node." Although the illustrated embodiment shows both of the PMOS transistors 54 and 55 coupled to the same ACT signal 52 and thus receiving the same voltage, some embodiments of the sense amplifier 50 may connect the PMOS transistors 54 and 55 to different ACT signals to enable the source terminals of the PMOS transistors 54 and 55 to be driven at different voltage levels. The ACT signal 52 is generally used to control data movement and control of the sense amplifier 50. Another terminal (e.g., drain) of the PMOS transistor 54 is coupled to a gut node a (GUTa) 56, and another terminal (e.g., drain) of the PMOS transistor 55 is coupled to a gut node b (GUTb) 58. The gate terminal of the PMOS transistor 54 is also coupled to the gut node b 58, and the gate terminal of the PMOS transistor 55 is also coupled to the gut node a 56. In other words, the PMOS transistors 54 and 55 are cross-coupled PMOS transistors coupled between the gut nodes and the ACT signal 52.

The sense amplifier 50 also includes an NMOS transistor 60 that has a terminal (e.g., source terminal) coupled to the gut node a 56 while the gate terminal of the NMOS transistor 62 is coupled to the gut node b 58. Similarly, the sense amplifier 50 also includes an NMOS transistor 62 that has a terminal (e.g., source terminal) coupled to the gut node b 58 while the gate terminal of the NMOS transistor 62 is coupled to the gut node a 56. The other terminals of the NMOS transistors 60 and 62 are coupled together to a signal 98. The signal 98 (e.g., NMOS strobe signal) may be a selectable voltage that may strobe the NMOS transistors 60 and 62 to a voltage level (e.g., ground) to complete latching once amplification in the sense amplifier 50 has amplified the relatively low voltage from the memory cell.

In some memory devices (e.g., AxRAM devices), one of the gut nodes (gut node a 56 or the gut node b 58) may be charged by the memory cell while the other gut node may be used as a reference voltage to interpret the charge from the memory cell. Either gut node may be the reference for the other. Accordingly, to enable the gut node a 56 to carry the reference voltage for comparison to a charge on the gut node b 58, the sense amplifier 50 includes a transistor 64 (e.g., an NMOS transistor) that utilizes an ARREFa signal 66 to apply a reference voltage 68 to the gut node a 56. Similarly, to enable the gut node b 58 to carry the reference voltage 68 for comparison to a charge on the gut node a 56, the sense amplifier 50 includes a transistor 70 (e.g., an NMOS transistor) that utilizes an ARREFb signal 72 to apply the reference voltage 68 to the gut node b 58. Furthermore, although the illustrated embodiment shows that the reference voltage 68 is the same for both gut nodes via the transistors 64 and 70, in some embodiments, the transistors 64 and 70 may apply different reference voltage levels.

Moreover, in some embodiments (e.g., AxRAM devices), the sense amplifier 50 may charge/discharge the gut nodes to a certain level (e.g., 0V or some other voltage) before charging a first gut node by the memory cell and charging a second gut node to the reference voltage 68. To charge/discharge the gut node a 56, the sense amplifier 50 includes a transistor 74 (e.g., NMOS transistor) that utilizes an ARPREa signal 76 to selectively couple the gut node a 56 to VSS 78 (e.g., 0V or some other voltage). Similarly, to charge/discharge the gut node b 58, the sense amplifier 50 includes a transistor 80 (e.g., NMOS transistor) that utilizes an ARPREb signal 82 to selectively couple the gut node b 58 to VSS 84 (e.g., 0V or some other voltage). The VSS 78 and the VSS 84 may be the same values as each other or different values from each other.

The gut node a 56 may receive charges from the memory cell via a local IO line (LIOa) 86. The gut node a 56 may also apply the amplified voltage from the sense amplifier back to the LIOa 86 after amplification. To control when the gut node a 56 receives a charge from the memory cell and/or transmits via the LIOa 86, the sense amplifier 50 includes a transistor 88 (e.g., NMOS transistor/isolating transistor) that selectively couples and decouples the gut node a 56 to and from the LIOa 86. The transistor 88 uses an ARLIOEn signal 90 to enable or disable the connection between the LIOa 86 and the gut node a 56.

Similarly, the gut node b 58 may receive charges from the memory cell via a local IO line (LIOb) 92. The gut node b 58 may also apply the amplified voltage from the sense amplifier back to the LIOb 92 after amplification. To control when the gut node b 58 receives a charge from the memory cell and/or transmits via the LIOb 92, the sense amplifier 50 includes a transistor 94 (e.g., NMOS transistor/isolating transistor) that selectively couples and decouples the gut node b 58 to and from the LIOb 92. The transistor 94 uses the ARLIOEn signal 90 to enable or disable the connection between the LIOb 92 and the gut node b 58.

To reduce the size of the memory device 10, the reference voltage 68 may be applied to charge either gut node via the ACT signal 52 through one of the PMOS latch devices (e.g., PMOS transistor 54 and 55). Using such techniques, the overall size of the sense amplifier 50 may be reduced. As can be appreciated, there are large numbers of sense amplifiers 13 in the memory device 10. Accordingly, even a small improvement to power or area consumption may have a significant impact on the overall design of the memory device 10. Thus, removing the transistors 64 and 70 from the sense amplifier 50 as illustrated in a sense amplifier 100 of FIG. 3, reduces the size of the sense amplifier 13 when the sense amplifier 100 is used to implement the sense amplifiers 13 rather than the sense amplifier 50.

Figure 3:
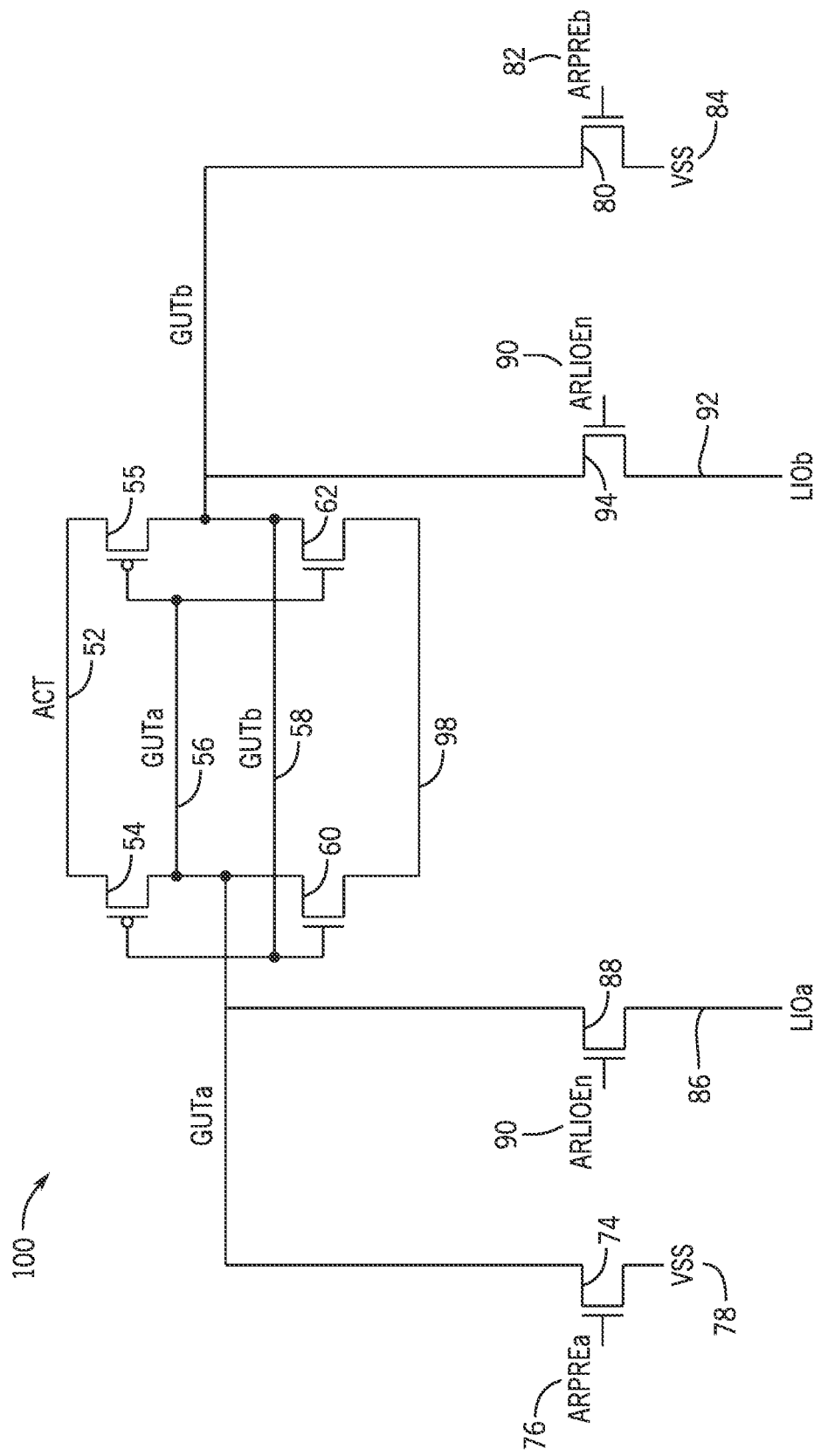
FIG. 3 is a circuit diagram of an alternative embodiment of the sense amplifiers of FIG. 1 without explicit reference transistors/switches in the sense amplifier, according to an embodiment of the present disclosure.

As illustrated in FIG. 3, the sense amplifier 100 functions identically to the sense amplifier 50 except that the transistors 64 and 70 are omitted with the reference voltage to be applied to the ACT signal 52 when one of the gut nodes is to be charged. By imparting the reference voltage 68 via the ACT signal 52, the sense amplifier 100 may have two less transistors than the sense amplifier 50 with the same read window (e.g., without a timing penalty in exchange for the reduced size).

Figure 4:
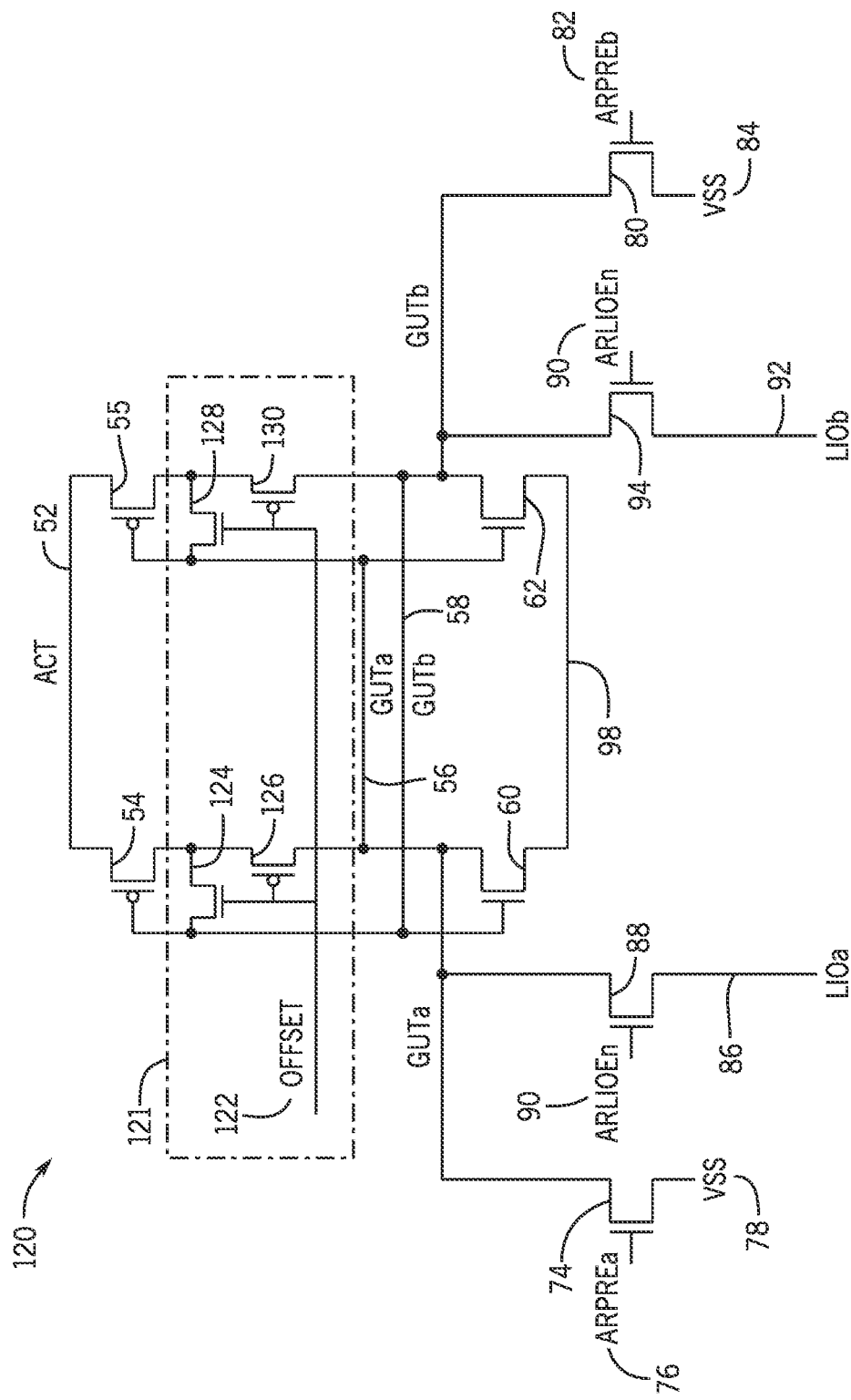
FIG. 4 is a circuit diagram of the embodiment of the sense amplifiers of FIG. 3 with threshold voltage compensation circuitry, according to an embodiment of the present disclosure.

In some memory devices, latch devices (e.g., PMOS transistors 54 and 55) may be mismatched with different threshold voltages. For example, the latch devices may have different respective threshold voltages due to PVT variations. To account for these mismatches, some embodiments of the memory device 10 may include threshold voltage compensation (VTC) circuitry. For example, FIG. 4 is a circuit diagram of a sense amplifier 120 that functions similar to the sense amplifier 100 of FIG. 3 except that the sense amplifier 120 includes VTC circuitry 121. As illustrated, the VTC circuitry 121 is disposed between the PMOS transistors 54 and 55 and the NMOS transistors 60 and 62 and utilizes an Offset signal 122 that is used to control when to apply VTC. Specifically, the VTC circuitry 121 includes a transistor 124 (e.g., NMOS transistor) that selectively couples the gate and drain terminals of the PMOS transistor 54 together based on the value of the Offset signal 122. The VTC circuitry 121 also includes a transistor 126 (e.g., PMOS transistor) between the drain terminal of the PMOS transistor 54 and the gut node a 56. The transistor 124 and the transistor 126 may be of different doping types to cause one transistor to act as an open switch and the other to act as a closed switch in response to the assertion of the Offset signal 122. Thus, when the transistor 124 acts as a closed switch to configure the PMOS transistor 54 in a diode configuration, the transistor 126 disconnects the PMOS transistor 54 from the gut node a 56.

Likewise, the VTC circuitry 121 includes a transistor 128 (e.g., NMOS transistor) that selectively couples the gate and drain terminals of the PMOS transistor 55 together based on the value of the Offset signal 122. The VTC circuitry 121 also includes a transistor 130 (e.g., PMOS transistor) between the drain terminal of the PMOS transistor 55 and the gut node b 58. The transistor 128 and the transistor 130 may be of different doping types to cause one transistor to act as an open switch and the other to act as a closed switch in response to the assertion of the Offset signal 122. Thus, when the transistor 128 acts as a closed switch to configure the PMOS transistor 55 in a diode configuration, the transistor 130 disconnects the PMOS transistor 55 from the gut node b 58.

With the PMOS transistors 54 and 55 in diode configurations, the gut nodes are charged with voltages proportional to the respective threshold voltages of the PMOS transistors 54 and 55. When VTC is disabled by deasserting the Offset signal 122 after it has been enabled, the functional connections of the sense amplifier 120 VTC circuitry 121 are exactly like those of the sense amplifier 100 without the VTC circuitry 121 except that the gut nodes of the sense amplifier 120 store charge to compensate for the threshold voltages of the PMOS transistors 54 and 55, such that any mismatches in PVT variations are compensated for by the stored charges on the gut nodes.

Figure 5:
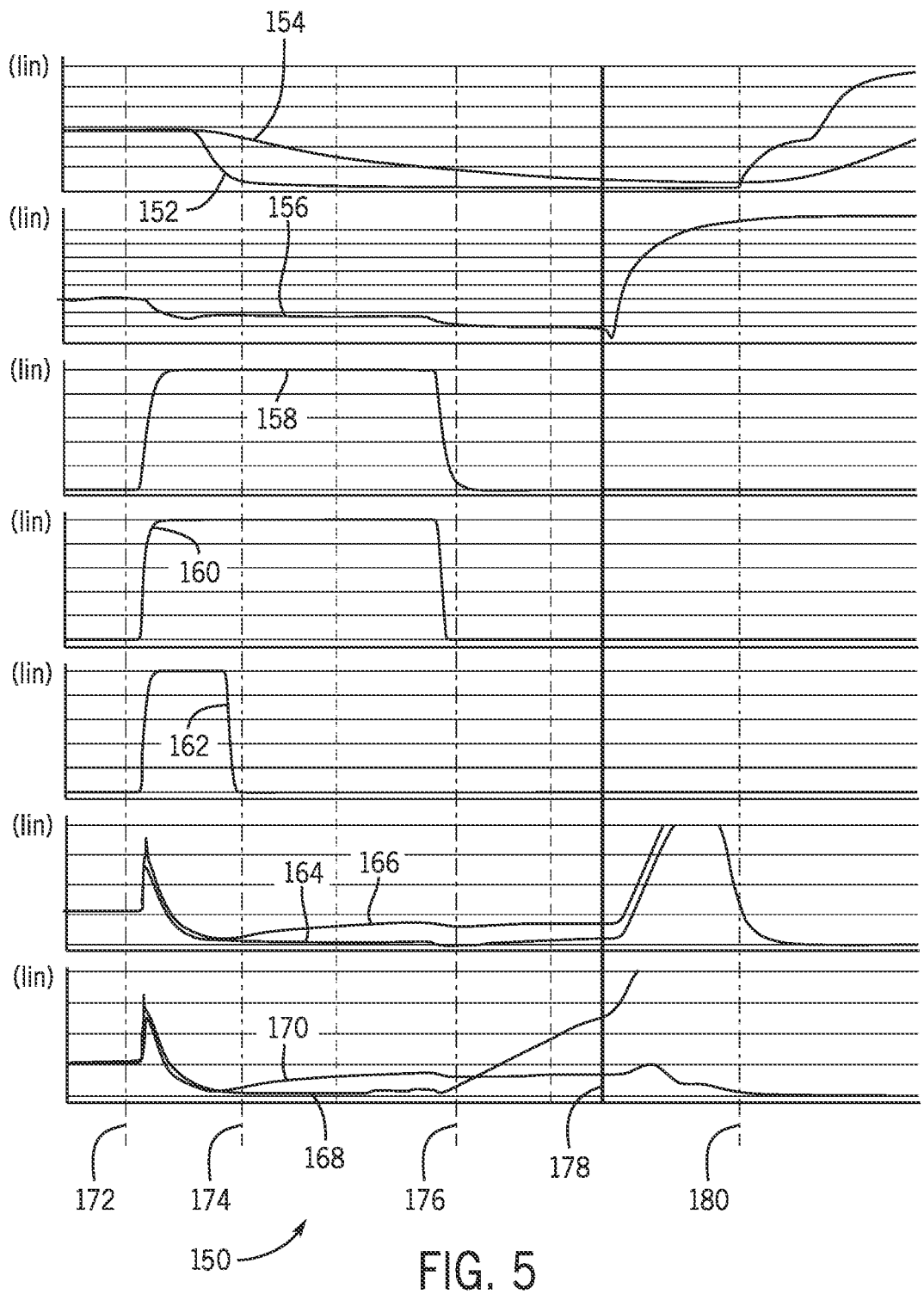
FIG. 5 is a graph of an embodiment of operation using the sense amplifiers of FIG. 4, according to an embodiment of the present disclosure.

FIG. 5 is a graph 150 showing an embodiment of operation using the sense amplifier 120. As illustrated, the graph 150 includes lines 152 and 154 that correspond to the voltage of respective wordlines. The line 152 corresponds to a wordline near its wordline driver, and the line 154 corresponds to a wordline far from its wordline driver. The graph 150 also includes a line 156 that corresponds to the voltage carried as the ACT signal 52. Moreover, the graph 150 includes a line 158 that corresponds to the Offset signal 122. The graph 150 further includes a line 160 that corresponds to the ARPREa signal 76 and a line 162 that corresponds to the ARPREb signal 82. The graph 150 also includes lines 164, 166, 168, and 170 that correspond to voltages on gut nodes of the sense amplifier 120. In some embodiments, the lines 164 and 166 correspond to a first iteration of the sense amplifier 120 in the memory device while the lines 168 and 170 correspond to a second iteration of the sense amplifier 120 in the memory device 10. Alternatively, the lines 164, 166, 168, and 170 correspond to the same sense amplifier 120, but the lines 164 and 166 correspond to a read with a different value stored in the memory cell than for lines 168 and 170.

Regardless of which sense amplifier 120 is represented by lines 164, 166, 168, and 170, the lines 164 and 168 correspond to the gut node(s) (e.g., the gut node a 56) that is used to read from the cell. Likewise, the lines 166 and 170 correspond to the gut node(s) (e.g., the gut node b 58) that is used to carry the reference voltage. Regarding the line 164, the corresponding memory cell stores a logic low value. Regarding the line 168, the corresponding memory cell stores a logic high value.

At time 172, the ARPREa signal 76 and the ARPREb signal 82 are asserted causing the gut node a 56 and the gut node b 58 to be discharged to VSS (e.g., to 0V) as illustrated by the lines 164, 166, 168, and 170. In certain embodiments, the discharged gut nodes may be pulled below 0V to lower the overall voltage to provide a larger window in interpreting the data in exchange for increased power consumption in the sense amplifier 120. In some embodiments, the ACT signal 52 may start at some non-zero voltage before the time 172 while, in other embodiments, the ACT signal 52 may start at 0V before the time 172.

Regardless, at time 174, the ACT signal 52 settles to the reference voltage to be applied to respective gut nodes (e.g., gut node b 58) to be used in interpreting the data from the memory cell used to charge the other gut nodes (e.g., gut node a 56). Also at time 174, the ARPREb signal 82 used to precharge the gut node b 58 is deasserted to enable the gut node b 58 to be charged to the reference voltage.

Furthermore, at time 174, the Offset signal 122 remains asserted to enable the VTC circuitry 121 to apply VTC while the far wordline corresponding to line 154 is still settling. Thus, using the foregoing signals, the gut node a 56 (lines 164 and 168) is precharged to 0V while the gut node b 58 (lines 166 and 170) undergoes VTC and is charged to the reference voltage.

At time 176, the Offset signal 122, the ARPREa signal 76 are deasserted, and the gut node a 56 is charged using the corresponding memory cell. Thus, the line 164 and 168 are charged to respective voltages. In other words, the line 168 is increased above the reference voltage stored in the gut node corresponding to the line 170 while the line 164 remains below line 166. Accordingly, when the NMOS transistors 60 and 62 are strobed using the signal 98 at latch time 178, the sense amplifier 120 corresponding to the lines 164 and 166 latches in a logic low value. Similarly, when the NMOS transistors 60 and 62 are strobed using the signal 98 at latch time 178, the sense amplifier 120 corresponding to the lines 168 and 170 latches in a logic high value. The output value is then output via Input/Output lines (e.g., LIOa 86 or LIOb 92) at time 180 based on which gut node voltage was higher at the time of latching.

Figure 6:
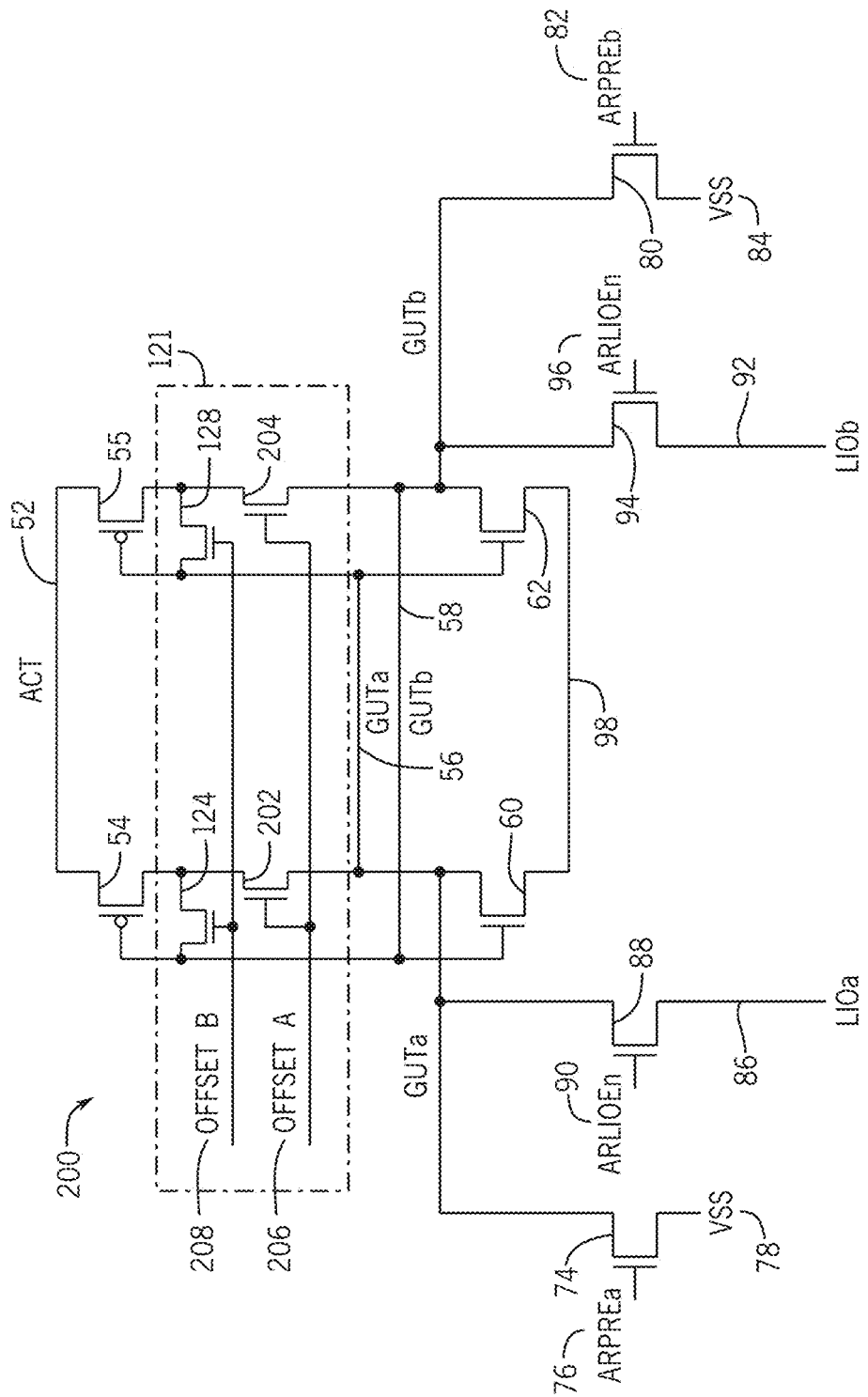
FIG. 6 is an alternative embodiment of the sense amplifier of FIG. 4 with multiple offset driving signals for the threshold compensation circuitry, according to an embodiment of the present disclosure.

Some embodiments of the sense amplifiers 13 may include various differences that function similarly but may have different configurations. For example, FIG. 6 illustrates a sense amplifier 200 that functions just as the sense amplifier 120 in FIG. 4 except that the transistors 126 and 130 have been replaced with transistors 202 and 204. As previously mentioned, the transistors 124 and 126 are doped differently than each other like the transistors 128 and 130 are doped differently than each other. In the sense amplifier 200, the transistors 124, 128, 202, and 204 are all of the same type. However, to make sure that the gut node a 56 is disconnected from the NMOS transistor 60 during VTC performed by coupling the drain and gate terminals of the PMOS transistor 54 together, the transistors 124 and 202 are controlled using different offset signals. For instance, the transistor 202 may be controlled with an Offset signal a 206, and the transistor 124 may be controlled with an Offset signal b 208. These signals may be complementary signals, but in some embodiments, the Offset signal a 206 may be used to connect the PMOS transistor 54 to the gut node a 56 only after the gate and drain terminals of the PMOS transistor 54 are disconnected from each other. In other words, the Offset signal a 206 is deasserted only after the Offset signal b 208 is deasserted. In some embodiments, the assertions of the Offset signal a 206 and the Offset signal b 208 may be asserted at the same time when initiating VTC. Alternatively, in other embodiments, the Offset signal a 206 may be asserted before the Offset signal b 208 is asserted.

Similarly, to make sure that the gut node b 58 is disconnected from the NMOS transistor 62 during VTC performed by coupling the drain and gate terminals of the PMOS transistor 54 together, the transistors 128 and 204 are controlled using different offset signals. For instance, the transistor 204 may be controlled with the Offset signal a 206, and the transistor 128 may be controlled with the Offset signal b 208. These signals may be complementary signals, but in some embodiments, the Offset signal a 206 may be used to connect the PMOS transistor 55 to the gut node b 58 only after the gate and drain terminals of the PMOS transistor 55 are disconnected from each other.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A method of operating a sense amplifier of a memory device, comprising:
applying a reference voltage to a first gut node of the sense amplifier via latch transistors;
applying a charge to a second gut node from a memory cell corresponding to the sense amplifier, wherein the latch transistors comprise a first latch PMOS transistor coupled to the first gut node and a second latch PMOS transistor coupled to the second gut node;
applying voltage threshold compensation to the first and second latch PMOS transistors, comprising:
 decoupling the first latch PMOS transistor from the first gut node;
 decoupling the second latch PMOS transistor from the second gut node;
 coupling two terminals of the first latch PMOS transistor together; and
 coupling two terminals of the second latch PMOS transistor together; and
latching, using the latch transistors, a value in the sense amplifier based on a relationship between the reference voltage and the charge.

2. The method of claim 1, wherein coupling the two terminals of the first latch PMOS transistor together comprises coupling a gate terminal of the first latch PMOS transistor and a drain terminal of the first latch PMOS transistor together via a first compensation transistor, and wherein coupling the two terminals of the second latch PMOS transistor together comprises coupling a gate terminal of the second latch PMOS transistor and a drain terminal of the second latch PMOS transistor together via a second compensation transistor.

3. The method of claim 1, wherein decoupling the first latch PMOS transistor from the first gut node is performed before coupling the two terminals of the first latch PMOS transistor together, and decoupling the second latch PMOS transistor from the second gut node is performed before coupling the two terminals of the second latch PMOS transistor together.

4. The method of claim 3, wherein decoupling the first latch PMOS transistor from the first gut node and decoupling the second latch PMOS transistor from the second gut node are performed using a first control signal, and coupling the two terminals of the first latch PMOS transistor together and coupling the terminals of the second latch PMOS transistor together are performed using a second control signal that is different than the first control signal.

5. The method of claim 1, comprising:
decoupling the two terminals of the first latch PMOS transistor from each other after applying voltage threshold compensation;
decoupling the two terminals of the second latch PMOS transistor from each other after applying voltage threshold compensation;
recoupling the first latch PMOS transistor to the first gut node after applying voltage threshold compensation; and
recoupling the second latch PMOS transistor to the second gut node after applying voltage threshold compensation.

6. The method of claim 5, wherein recoupling the first latch PMOS transistor to the first gut node is performed after decoupling the two terminals of the first latch PMOS transistor, and recoupling the second latch PMOS transistor to the second gut node is performed after decoupling the two terminals of the second latch PMOS transistor.

7. The method of claim 1, comprising:
precharging the first gut node to a voltage level using a first precharge transistor; and
precharging the second gut node to the voltage level using a second precharge transistor.

8. The method of claim 7, wherein the voltage level comprises 0V.

9. The method of claim 7, wherein precharging the first gut node and the second gut node to the voltage level occurs before applying the reference voltage to the first gut node and before applying the charge to the second gut node.

10. A sense amplifier, comprising:
a first latch transistor, comprising:
 a first terminal of the first latch transistor coupled to a top node;
 a second terminal of the first latch transistor coupled to a first gut node; and
 a third terminal of the first latch transistor coupled to a second gut node, wherein the first latch transistor is configured to supply a first reference voltage from the top node through the first latch transistor to the first gut node when the second gut node is to receive a first charge from one or more memory cells corresponding to the sense amplifier for sensing, and the first reference voltage is used to interpret a first logic value of the first charge;
a second latch transistor, comprising:
 a first terminal of the second latch transistor coupled to the top node;
 a second terminal of the second latch transistor coupled to the second gut node; and
 a third terminal of the second latch transistor coupled to the first gut node, wherein the second latch transistor is configured to supply a second reference voltage from the top node through the second latch transistor to the second gut node when the first gut node is to receive a second charge from the one or more memory cells corresponding to the sense amplifier for sensing, and the second reference voltage is used to interpret a second logic value of the second charge;
a first precharge transistor configured to precharge the first gut node to a voltage level; and
a second precharge transistor configured to precharge the second gut node to the voltage level, wherein the voltage level comprises 0V.

11. The sense amplifier of claim 10, wherein precharging the first gut node to the voltage level and the second gut node to the voltage level occurs before charging the first gut node using the first reference voltage and charging the second gut node using the first charge.

12. The sense amplifier of claim 10, wherein precharging the first gut node to the voltage level and the second gut node to the voltage level occurs before charging the second gut node using the second reference voltage and charging the first gut node using the second charge.

13. The sense amplifier of claim 10, wherein the first latch transistor comprises a first PMOS transistor, and the second latch transistor comprises a second PMOS transistor.

14. The sense amplifier of claim 10, comprising:
- a first compensation transistor configured to selectively couple the second and third terminals of the first latch transistor together during threshold voltage compensation;
- a second compensation transistor configured to selectively decouple the first latch transistor from the first gut node during threshold voltage compensation;
- a third compensation transistor configured to selectively couple the second and third terminals of the second latch transistor together during threshold voltage compensation; and
- a fourth compensation transistor configured to selectively decouple the second latch transistor from the second gut node during threshold voltage compensation.

15. The sense amplifier of claim 14, wherein the first, second, third, and fourth compensation transistors are controlled using a single control signal, the first and third compensation transistors have a first doping type, and the second and fourth compensation transistors have a second doping type that is different than the first doping type.

16. The sense amplifier of claim 14, wherein the first, second, third, and fourth compensation transistors are all of the same doping type, the first and third compensation transistors are controlled using a first control signal, and the second and fourth compensation transistors are controlled using a second control signal.

17. A memory device, comprising:
- one or more memory cells configured to store data;
- a pair of digit lines coupled to the one or more memory cells; and
- a sense amplifier coupled to the pair of digit lines and comprising:
  - cross-coupled transistors coupled to a first node;
  - a first gut node coupled to a first transistor of the cross-coupled transistors, wherein the first gut node corresponds to a first digit line of the pair of digit lines, and the first transistor is configured to supply a first reference voltage to the first gut node;
  - a second gut node coupled to a second transistor of the cross-coupled transistors, wherein the second gut node corresponds to a second digit line of the pair of digit lines, and the second transistor is configured to supply a second reference voltage to the second gut node;
  - a third transistor coupled to the first gut node;
  - a fourth transistor coupled to the second gut node;
  - a first isolating transistor coupled between the first digit line and the first gut node to selectively decouple the first digit line from the first gut node when amplifying voltages on the first or second gut nodes;
  - a second isolating transistor coupled between the second digit line and the second gut node to selectively decouple the second digit line from the second gut node when amplifying voltages on the first and second gut nodes;
  - a first compensation transistor configured to selectively couple the first transistor in a diode configuration by coupling gate and drain terminals of the first transistor during voltage threshold compensation;
  - a second compensation transistor configured to selectively decouple the first transistor from the first gut node during voltage threshold compensation;
  - a third compensation transistor configured to selectively couple the second transistor in a diode configuration by coupling gate and drain terminals of the second transistor during voltage threshold compensation; and
  - a fourth compensation transistor configured to selectively decouple the second transistor from the second gut node during voltage threshold compensation.

18. The memory device of claim 17, wherein the first and second transistors comprise PMOS transistors.

19. The memory device of claim 17, wherein threshold voltage compensation comprises:
- charging the first gut node to a first charge level that is proportional to a threshold voltage of the first transistor; and
- charging the second gut node to a second charge level that is proportional to a threshold voltage of the second transistor.

20. The memory device of claim 17, wherein threshold voltage compensation occurs while a wordline voltage is ramping in the memory device.

21. The memory device of claim 17, comprising a first precharge transistor coupled to the first gut node and configured to charge the first gut node to a voltage level as part of a precharge.

22. The memory device of claim 21, comprising a second precharge transistor coupled to the second gut node and configured to charge the second gut node to the voltage level as part of the precharge.

23. The memory device of claim 22, wherein the voltage level comprises 0V.

* * * * *